(12) United States Patent
Chan et al.

(10) Patent No.: US 8,718,190 B2
(45) Date of Patent: May 6, 2014

(54) RECEIVER/TRANSMITTER CAPABLE OF SIMULTANEOUSLY RECEIVING/TRANSMITTING DISCONTINUOUS FREQUENCY SIGNALS AND METHOD THEREOF

(75) Inventors: Ka-Un Chan, Hsinchu County (TW); Chin-Lung Li, Taoyuan County (TW)

(73) Assignee: Realtek Semiconductor Corp., Hsinchu (TW)

(*) Notice: Subject to any disclaimer, the term of this patent is extended or adjusted under 35 U.S.C. 154(b) by 0 days.

(21) Appl. No.: 13/482,990

(22) Filed: May 29, 2012

(65) Prior Publication Data
US 2012/0314810 A1  Dec. 13, 2012

(30) Foreign Application Priority Data
Jun. 10, 2011 (TW) .............................. 100120396 A (51) Int. Cl.
H04B 1/26  (2006.01)
H04B 1/04  (2006.01)
H04B 1/66  (2006.01)
H04L 27/20  (2006.01)
H04L 27/22  (2006.01)

(52) U.S. Cl.
USPC ........... 375/307; 375/324; 375/303; 375/316; 375/295; 375/322; 375/302; 455/118; 455/91; 455/313

(58) Field of Classification Search
USPC ................ 375/324, 295, 322, 302, 316, 307; 455/318, 313, 130, 118, 91, 102, 455/552.1, 88, 73
See application file for complete search history.

(56) References Cited

U.S. PATENT DOCUMENTS

| | | | |
|---|---|---|---|
| 6,381,460 B1* | 4/2002 | Klein et al. .................... 455/450 |
| 8,467,753 B2* | 6/2013 | Carrera et al. ............. 455/188.1 |
| 2002/0173337 A1* | 11/2002 | Hajimiri et al. ............... 455/552 |
| 2007/0087711 A1* | 4/2007 | Pan ............................ 455/127.4 |
| 2009/0036069 A1* | 2/2009 | Seckin et al. ................. 455/118 |
| 2009/0054014 A1* | 2/2009 | Seo et al. ...................... 455/101 |
| 2009/0088091 A1* | 4/2009 | Shen et al. .................... 455/102 |
| 2011/0140746 A1* | 6/2011 | Park et al. ..................... 327/156 |

* cited by examiner

*Primary Examiner* — Chieh M Fan
*Assistant Examiner* — Michelle M Koeth
(74) *Attorney, Agent, or Firm* — McClure, Qualey & Rodack, LLP (57) ABSTRACT

A receiver/transmitter and related receiving/method capable of simultaneously receiving/transmitting discontinuous frequency band signal components of an input/output signal are provided. Phase swapping on in-phase/quadrature-phase local oscillation differential signals is applied to frequency down-conversion of the input signal or frequency up-conversion of a baseband signal to be outputted to radio domain, and thereby achieve simultaneously receiving discontinuous frequency bands of the input signal and simultaneously sending different baseband signal components on discontinuous frequency bands of the output signal.

19 Claims, 8 Drawing Sheets

RECEIVER/TRANSMITTER CAPABLE OF SIMULTANEOUSLY RECEIVING/TRANSMITTING DISCONTINUOUS FREQUENCY SIGNALS AND METHOD THEREOF

BACKGROUND OF THE INVENTION

1. Field of the Invention

The present invention relates to a signal processing scheme, and more particularly to a receiver and a transmitter capable of simultaneously receiving and transmitting discontinuous frequency band signal components of an input signal and methods thereof.

2. Description of the Prior Art

Generally speaking, a conventional transceiver configuration mainly comprises a direction conversion transceiver configuration and a two-step conversion transceiver configuration. For example, U.S. Pat. No. 5,878,332 disclosed a transceiver implemented with two antennas wherein one antenna is used for receiving and transmitting signals of a band and the other antenna is used for receiving and transmitting signals of another band. Band pass filters are further employed by U.S. Pat. No. 5,878,332 for receiving and transmitting signals of the two different bands, respectively. A drawback of the transceiver provided by U.S. Pat. No. 5,878,332 is that such transceiver is not able to simultaneously receive the signals of the two different bands and is not able to simultaneously transmit the signals of the two different bands. Further, U.S. Pat. No. 7,613,430 disclosed a transceiver which performs two-step down-conversion upon a received signal and appropriately selects frequencies of two different synthesizers to avoid affection of disturbing signal components, by using a radio-frequency (RF) synthesizer and an intermediate frequency (IF) synthesizer. However, such transceiver provided by U.S. Pat. No. 7,613,430 is merely used for receiving/transmitting continuous frequency band signals but cannot be utilized for receiving and transmitting signals with discontinuous frequency bands. Moreover, U.S. Pat. No. 7,266,352 disclosed using three different local oscillation frequency signals to respectively perform down-conversion upon three different frequency band signals (802.11b/g, 802.11a (low band)/j, and 802.11a (high band)) and using another local oscillation frequency signal to down-convert these down-converted signals into baseband domain. U.S. Pat. No. 7,266,352 disclosed using a similar signal transmission scheme to perform two-step up-conversion to obtain three different frequency band signals. However, this reception/transmission circuit configuration cannot simultaneously process discontinuous frequency band signals at the same time.

As a result, it is necessary for the above-mentioned transceivers to receive discontinuous frequency band signals at different and separate timings and to transmit/emit discontinuous frequency band signals at different and separate timings.

SUMMARY OF THE INVENTION

It is therefore one of the objectives of the present invention to provide a receiver and corresponding method for simultaneously receiving discontinuous frequency band signal components of an input signal at the same time, and to provide a transmitter and corresponding method for simultaneously transmitting discontinuous frequency band signal components of an output signal at the same time, so as to solve the described-above problems.

According to an embodiment of the present invention, a receiver capable of simultaneously receiving discontinuous frequency band signal components of an input signal at the same time is disclosed. The receiver comprises a frequency synthesizer and a down-conversion circuit. The frequency synthesizer is used for generating an in-phase local oscillation differential signal and a quadrature-phase local oscillation differential signal. The down-conversion circuit is coupled to the frequency synthesizer, and utilized for performing frequency down-conversion upon the input signal to generate a first down-converted signal by using the in-phase local oscillation differential signal and the quadrature-phase local oscillation differential signal, and performing the frequency down-conversion upon the input signal to generate a second down-converted signal by using the in-phase local and quadrature-phase oscillation differential signals that have been phase-swapped.

According to an embodiment of the present invention, a method capable of simultaneously receiving discontinuous frequency band signal components of an input signal is disclosed. The method comprises: providing an in-phase local oscillation differential signal and a quadrature-phase local oscillation differential signal; performing frequency down-conversion upon the input signal to generate a first down-converted signal by utilizing the in-phase and quadrature-phase local oscillation differential signals; and performing the frequency down-conversion upon the input signal to generate a second down-converted signal by using the in-phase local and quadrature-phase oscillation differential signals that have been phase-swapped.

According to an embodiment of the present invention, a transmitter capable of simultaneously transmitting discontinuous frequency band signal components of an output signal is disclosed. The transmitter comprises a frequency synthesizer and an up-conversion circuit. The frequency synthesizer is utilized for generating an in-phase local oscillation differential signal and a quadrature-phase local oscillation differential signal. The up-conversion circuit is coupled to the frequency synthesizer, and utilized for performing frequency up-conversion upon a first transmitted signal to generate a first up-converted signal by utilizing the in-phase local oscillation differential signal and the quadrature-phase local oscillation differential signal, and performing the frequency up-conversion upon a second transmitted signal to generate a second up-converted signal by utilizing the in-phase local oscillation differential signal and the quadrature-phase local oscillation differential signal that have been phase swapped. The first and second up-converted signals respectively correspond to the discontinuous frequency band signal components in the output signal.

According to an embodiment of the present invention, a method capable of simultaneously transmitting discontinuous frequency band signal components of an output signal is disclosed. The method comprises: providing an in-phase local oscillation differential signal and a quadrature-phase local oscillation differential signal; performing frequency up-conversion upon a first transmitted signal to generate a first up-converted signal by utilizing the in-phase local oscillation differential signal and the quadrature-phase local oscillation differential signal; and performing the frequency up-conversion upon a second transmitted signal to generate a second up-converted signal by utilizing the in-phase local oscillation differential signal and the quadrature-phase local oscillation differential signal that have been phase swapped; wherein the first and second up-converted signals respectively correspond to the discontinuous frequency band signal components in the output signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
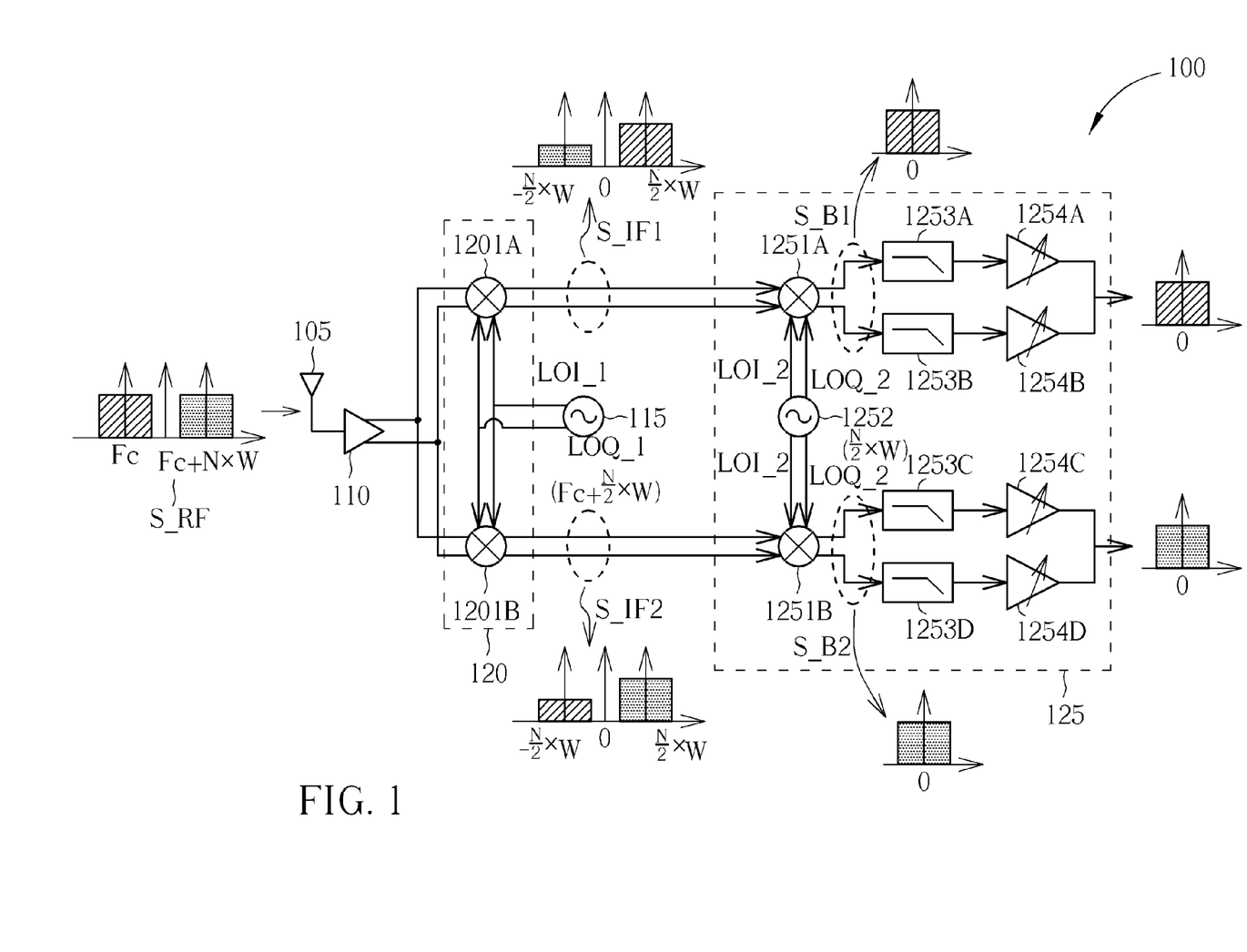
FIG. 1 is a diagram illustrating a receiver according to a first embodiment of the present invention.

Please refer to FIG. 1, which is a diagram illustrating a receiver 100 according to a first embodiment of the present invention. The receiver 100 comprises an antenna 105, a low noise amplifier 110, a frequency synthesizer 115, a down-conversion circuit 120, and a processing circuit 125. The input radio-frequency (RF) signal S_RF comprises discontinuous frequency band signal components including a first frequency band and a second frequency band. In this embodiment, the RF signal S_RF comprises a first frequency band signal component having a center frequency $F_C$ that is indicated by slash lines of FIG. 1 and a second frequency band signal component having a center frequency $F_C+N*W$ that is indicated by dots of FIG. 1. The value N is an integer that is greater than or equal to 2, and the value W indicates the bandwidth of the first and second frequency bands. For example, the bandwidth is 80 MHz. In another embodiment, the input signal can be represented by a differential signal and comprises a positive terminal signal $RF^+$ and a negative terminal signal $RF^-$, as shown in FIG. 2A and FIG. 2B.

In this embodiment, the RF signal S_RF is transmitted to the low noise amplifier 110 via the antenna 105, and the low noise amplifier 110 effectively attenuates noise of the RF signal S_RF and amplifies the signal components of the RF signal S_RF, to increase the signal-to-noise (SNR) of the RF signal S_RF. The down-conversion circuit 120 is arranged to perform two-way down-conversion upon the RF signal S_RF to generate the first down-converted signal S_IF1 and the second down-converted signal S_IF2. The down-converted signals S_IF1 and S_IF2 are intermediate frequency (IF) signals and respectively represented by differential signals as shown in FIG. 2A and FIG. 2B. The down-conversion circuit 120 comprises RF IQ mixers 1201A and 1201B that are arranged to respectively receive oscillation signals LOI_1 and LOQ_1 provided by the frequency synthesizer 115. The first down-converted signal S_IF1 is used for separating a frequency band signal having a center frequency $F_C$ included within the RF signal S_RF. The second down-converted signal S_IF2 is used for separating a frequency band signal having a center frequency $F_C+N*W$ included within the RF signal S_RF. In addition, the above-mentioned two-way down-conversion is performed based on in-phase and quadrature-phase signals of the same local oscillation frequency, and the only difference is that the in-phase and quadrature-phase local oscillation signals are phase swapped in one branch of the two-way down-conversion. The two-way down-conversion can therefore regarded as the same down-conversion processing operation used for respectively generating the first down-converted signal S_IF1 and the second down-converted signal S_IF2. Accordingly, by employing the circuitry structure of the down-conversion circuit 120, it is able to simultaneously receive, retrieve, or process two discontinuous frequency band signal components during the same down-conversion processing operation by merely swapping phases of the in-phase and quadrature-phase local oscillation signals.

The output frequency of the frequency synthesizer 115 is referenced/adopted by the down-conversion circuit 120 and used as the local oscillation frequency. For the frequency synthesizer 115, in order to appropriately separate two discontinuous frequency band signals, the oscillation frequency is determined and located at the center between the two center frequencies of two discontinuous frequency band signals. For example, the center frequencies of two discontinuous frequency band signals in the RF signal S_RF are $F_C$ and $F_C+N*W$ respectively, and the oscillation frequency of the frequency synthesizer 115 is selected as $F_C+(N/2)*W$. The oscillation output signals generated by the frequency synthesizer 115 are respectively the in-phase local oscillation differential signal LOI_1 and the quadrature-phase local oscillation differential signal LOQ_1 wherein the in-phase local oscillation differential signal LOI_1 includes the positive terminal signal $LOI^+$ and negative terminal signal $LOI^-$ as shown in FIG. 2A and FIG. 2B and the quadrature-phase local oscillation differential signal LOQ_1 includes the positive terminal signal $LOQ^+$ and negative terminal signal $LOQ^-$ as shown in FIG. 2A and FIG. 2B. The in-phase and quadrature-phase local oscillation differential signals LOI_1 and LOQ_1 are respectively inputted into the first and second down-conversion units 1201A and 1201B of the down-conversion circuit 120. The first down-conversion unit 1201A refers to the in-phase positive and negative terminal signals $LOI^+$ and $LOI^-$ and the quadrature-phase positive and negative terminal signals $LOQ^+$ and $LOQ^-$ to generate the first down-converted signal S_IF1. In addition, when generating the second down-converted signal S_IF2, the down-conversion circuit 120 performs phase swapping upon the positive and negative terminal signals of one of the in-phase and quadrature-phase local oscillation differentials LOI_1 and LOQ_1 to obtain the in-phase and quadrature-phase local oscillation differentials LOI_1 and LOQ_1 that are phase swapped. Thereafter, the down-conversion circuit 120 performs down-conversion operation upon the input RF signal S_RF based on the in-phase and quadrature-phase local oscillation differentials LOI_1 and LOQ_1 that have been phase swapped, so as to generate the second down-converted signal S_IF2. In practice, the in-phase positive and negative terminal signals $LOI^+$ and $LOI^-$ and the quadrature-phase positive and negative terminal signals $LOQ^+$ and $LOQ^-$ are also inputted to the second down-conversion unit 1201B. Accordingly, the second down-conversion unit 1201B generates the second down-converted signal S_IF2 by referring to the in-phase positive and negative terminal signals $LOI^+$ and $LOI^-$ and the quadrature-phase positive and negative terminal signals $LOQ^+$ and $LOQ^-$. In detail, the circuitry configuration for connecting the signals $LOI^+$, $LOI^-$, $LOQ^+$, and $LOQ^-$ to the first down-conversion unit 1201A is different from the circuitry configuration for connecting the signals $LOI^+$, $LOI^-$, $LOQ^+$, and LOQ⁻ to the second down-conversion unit 1201B, and phase swapping operation is achieved.

Figure 2A:
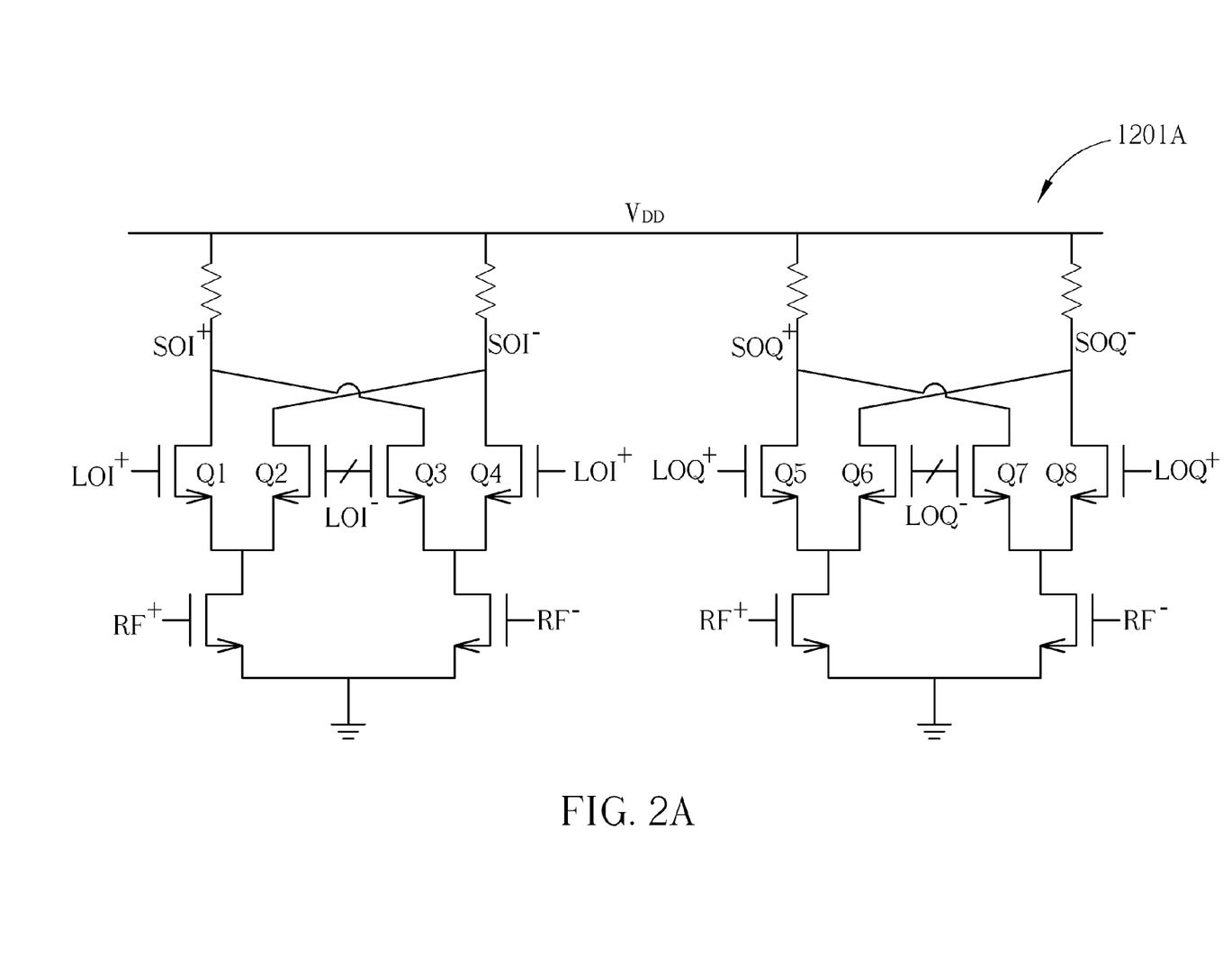
FIG. 2A is a circuitry diagram of a radio-frequency input stage and an intermediate frequency output stage of the first down-conversion unit in the down-conversion circuit as shown in FIG. 1.
Figure 2B:
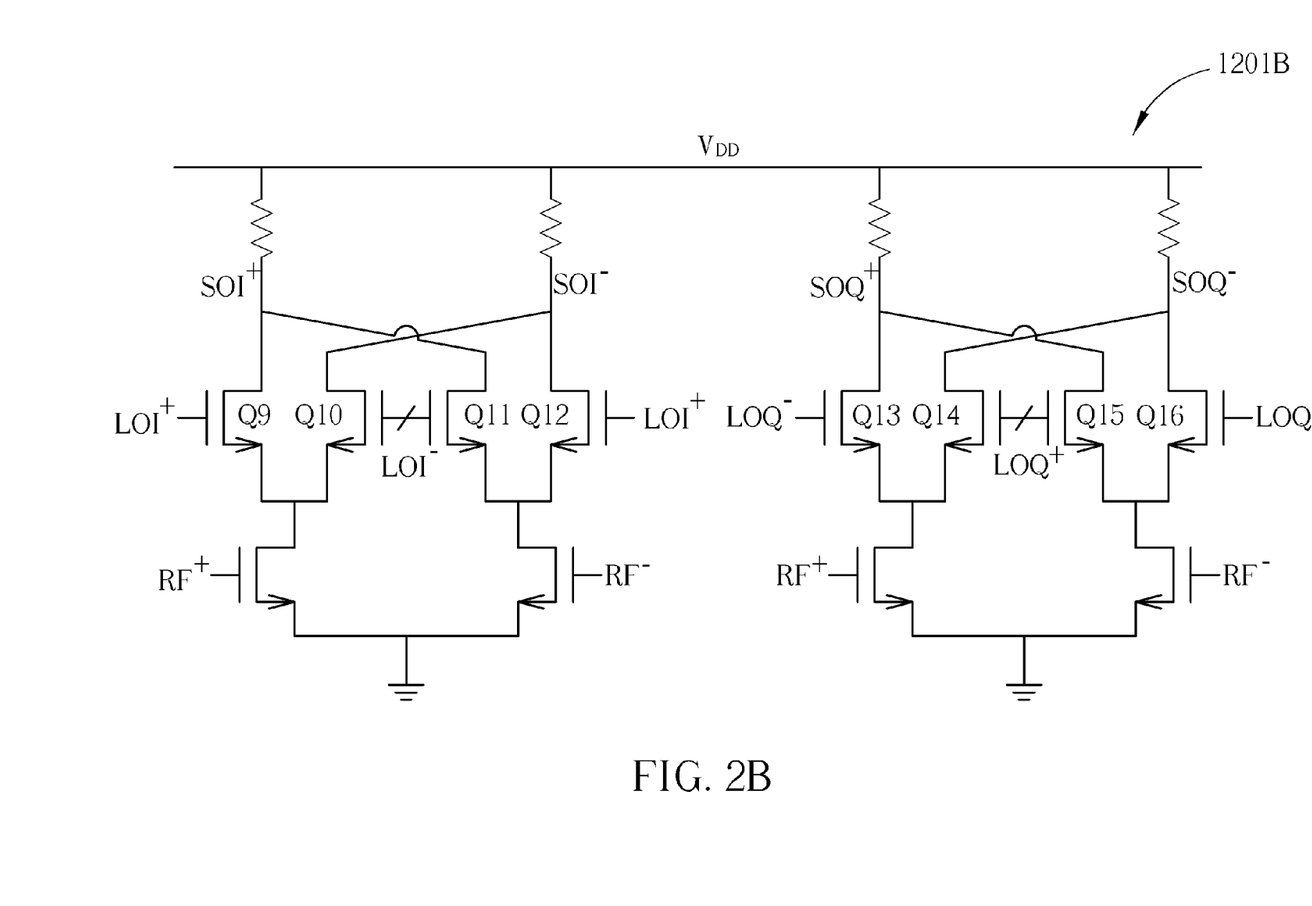
FIG. 2B is a circuitry diagram of a radio-frequency input stage and an intermediate frequency output stage of the second down-conversion unit in the down-conversion circuit as shown in FIG. 1.

Please refer to FIG. 2A in conjunction with FIG. 2B. FIG. 2A and FIG. 2B are diagrams illustrating RF input stages and IF output stages of the first and second down-conversion units 1201A and 1201B included within the down-conversion circuit 120 as shown in FIG. 1, respectively. The RF input stage of the first down-conversion unit 1201A is composed by two different sets of transistor differential pairs, and is used for receiving the differential input signal S_RF including signals RF⁺ and RF⁻. The IF output stage of the first down-conversion unit 1201A includes an in-phase IF output stage and a quadrature-phase IF output stage. The in-phase IF output stage is comprised by four transistor switches Q1-Q4 and used for receiving the in-phase positive and negative terminal signals LOI⁺ and LOI⁻, controlling these transistor switches Q1-Q4 by referring to the signals LOI⁺ and LOI⁻ so as to perform down-conversion upon the input differential signal S_RF for generating the in-phase positive and negative terminal down-converted signals SOI⁺ and SOI⁻. The in-phase signal components of the first down-converted signal S_IF1 are formed by the in-phase positive and negative terminal down-converted signals SOI⁺ and SOI⁻. The quadrature-phase IF output stage is comprised by four transistor switches Q5-Q8 and utilized for receiving the quadrature-phase positive and negative terminal signals LOQ⁺ and LOQ⁻, controlling these transistor switches Q5-Q8 by referring to the signals LOQ⁺ and LOQ⁻ so as to perform down-conversion upon the input differential signal S_RF for generating the in-phase positive and negative terminal down-converted signals SOQ⁺ and SOQ⁻. The quadrature-phase signal components of the first down-converted signal S_IF1 are formed by the quadrature-phase positive and negative terminal down-converted signals SOQ⁺ and SOQ⁻. In other words, the first down-converted signal S_IF1 is formed by these signals SOI⁺, SOI⁻, SOQ⁺, and SOQ⁻ that are outputted by the first down-conversion unit 1201A as shown in FIG. 2A.

For the second down-conversion unit 1201B, the RF input stage of the second down-conversion unit 1201B is composed by two different sets of transistor differential pairs, and is used for receiving the differential input signal S_RF including signals RF⁺ and RF⁻. The IF output stage of the second down-conversion unit 1201B includes an in-phase IF output stage and a quadrature-phase IF output stage. The in-phase IF output stage is comprised by four transistor switches Q9-Q12 and used for receiving the in-phase positive and negative terminal signals LOI⁺ and LOI⁻, controlling these transistor switches Q9-Q12 by referring to the signals LOI⁺ and LOI⁻ so as to perform down-conversion upon the input differential signal S_RF for generating the in-phase positive and negative terminal down-converted signals SOI⁺ and SOI⁻. The in-phase signal components of the second down-converted signal S_IF2 are formed by the in-phase positive and negative terminal down-converted signals SOI⁺ and SOI⁻. The quadrature-phase IF output stage is comprised by four transistor switches Q13-Q16 and utilized for receiving the quadrature-phase positive and negative terminal signals LOQ⁺ and LOQ⁻, controlling these transistor switches Q13-Q16 by referring to the signals LOQ⁺ and LOQ⁻ so as to perform down-conversion upon the input differential signal S_RF for generating the in-phase positive and negative terminal down-converted signals SOQ⁺ and SOQ⁻. The quadrature-phase signal components of the second down-converted signal S_IF2 are formed by the quadrature-phase positive and negative terminal down-converted signals SOQ⁺ and SOQ⁻. In other words, the second down-converted signal S_IF2 is formed by these signals SOI⁺, SOI⁻, SOQ⁺, and SOQ⁻ that are outputted by the second down-conversion unit 1201B as shown in FIG. 2B.

It should be noted that the quadrature-phase positive and negative terminal signals LOQ⁺ and LOQ⁻ are respectively coupled to the corresponding nodes/terminals of the quadrature-phase IF output stage in the first down-converted unit 1201A. For example, the positive terminal LOQ⁺ is coupled to the control terminals of transistor switch Q5 and Q8, and the negative terminal signal LOQ⁻ is coupled to the control terminals of transistor switch Q6 and Q7. For the quadrature-phase IF output stage in the second down-converted unit 1201B, a difference is that the corresponding nodes/terminals that are coupled to the signals LOQ⁺ and LOQ⁻ are exchanged. For example, the positive terminal signal LOQ⁺ is coupled to control terminals of the transistor switches Q14 and Q15, and the negative terminal signal LOQ⁻ is coupled to control terminals of the transistor switches Q13 and Q16. This circuitry configuration is used to achieve performing phase swapping upon the input signal. However, this is one of embodiments of phase swapping and merely used for illustrative purposes. This embodiment is not intended to be a limitation of the present invention. Additionally, in another embodiment, performing phase swapping upon the input signal can be achieved by exchanging the corresponding nodes/terminals that are coupled to the in-phase positive and negative terminal signals LOI⁺ and LOI⁻. That is, in the down-conversion circuit 120, the positive and negative differential signals LOQ⁺ and LOQ⁻ of the quadrature-phase local oscillation differential signal LOQ can be exchanged to achieve phase swapping operation; In addition, the positive and negative differential signals LOI⁺ and LOI⁻ of the in-phase local oscillation differential signal LOI can be exchanged to achieve phase swapping operation. These modifications all fall within the scope of the present invention.

Please refer to FIG. 1 again. The first down-converted signal S_IF1 mentioned above is an IF lower sideband signal, and the second down-converted signal S_IF2 is an IF upper sideband signal. As shown in FIG. 1, the first down-converted signal S_IF1 includes signal components (as illustrated by backslash lines) having a center frequency (N/2)*W and signal components (as illustrated by dots) having a center frequency (−N/2)*W; the intensities of signal components as illustrated by dots are suppressed. In addition, the second down-converted signal S_IF2 includes signal components (as illustrated by dots) having a center frequency (N/2)*W and signal components (as illustrated by backslash lines) having a center frequency (−N/2)*W; the intensities of signal components as illustrated by backslash lines are suppressed. As a result, in addition to effectively separating two discontinuous frequency ban signals, the down-conversion circuit 120 can appropriately perform signal intensity suppression upon undesired frequency band signal components. Accordingly, the baseband signal can easily be obtained by merely performing simple IF-to-baseband conversion operation. As shown in FIG. 1, the processing circuit 125 comprises mixers 1251A and 1251B, a frequency synthesizer 1252, filters 1253A-1253D, and gain amplifiers 1254A-1254D. The frequency synthesizer 1252 adopts the local oscillation frequency (N/2)*W and generates the in-phase and quadrature-phase local oscillation differential signals LOI_2 and LOQ_2 accordingly. The in-phase and quadrature-phase local oscillation differential signals LOI_2 and LOQ_2 are outputted by the frequency synthesizer 1252 to the mixers 1251A-1251B. The mixer 1251A can consequently convert the IF lower sideband signal (i.e. the first down-converted signal S_IF1) into a baseband signal by referring to the in-phase and quadrature-phase local oscillation differential signals LOI_2 and LOQ_2, so as to generate the first received signal S_B1 (i.e. the baseband signal). Similarly, the mixer 1251B can converts the IF upper sideband signal (i.e. the second down-converted signal S_IF2) into a baseband signal by referring to the in-phase and quadrature-phase local oscillation differential signals LOI_2 and LOQ_2, so as to generate the second received signal S_B2 (i.e. the baseband signal). Thereafter, the in-phase and quadrature-phase signal components of the baseband signal S_B1 can be processed by the filters 1253A and 1253B and the gain amplifiers 1254A and 1254B, respectively. Similarly, the in-phase and quadrature-phase signal components of the baseband signal S_B2 are processed by filters 1253C and 1253D and gain amplifiers 1254C and 1254D, respectively. As a result, undesired disturbing signal sources can be filtered out. In addition, in order to achieve better suppression for image frequency signal components, a mixer configuration having a higher image rejection ratio (IRR) can be employed to implement the first and second down-conversion units 1201A and 1201B and the mixers 1251A and 1251B.

Figure 3:
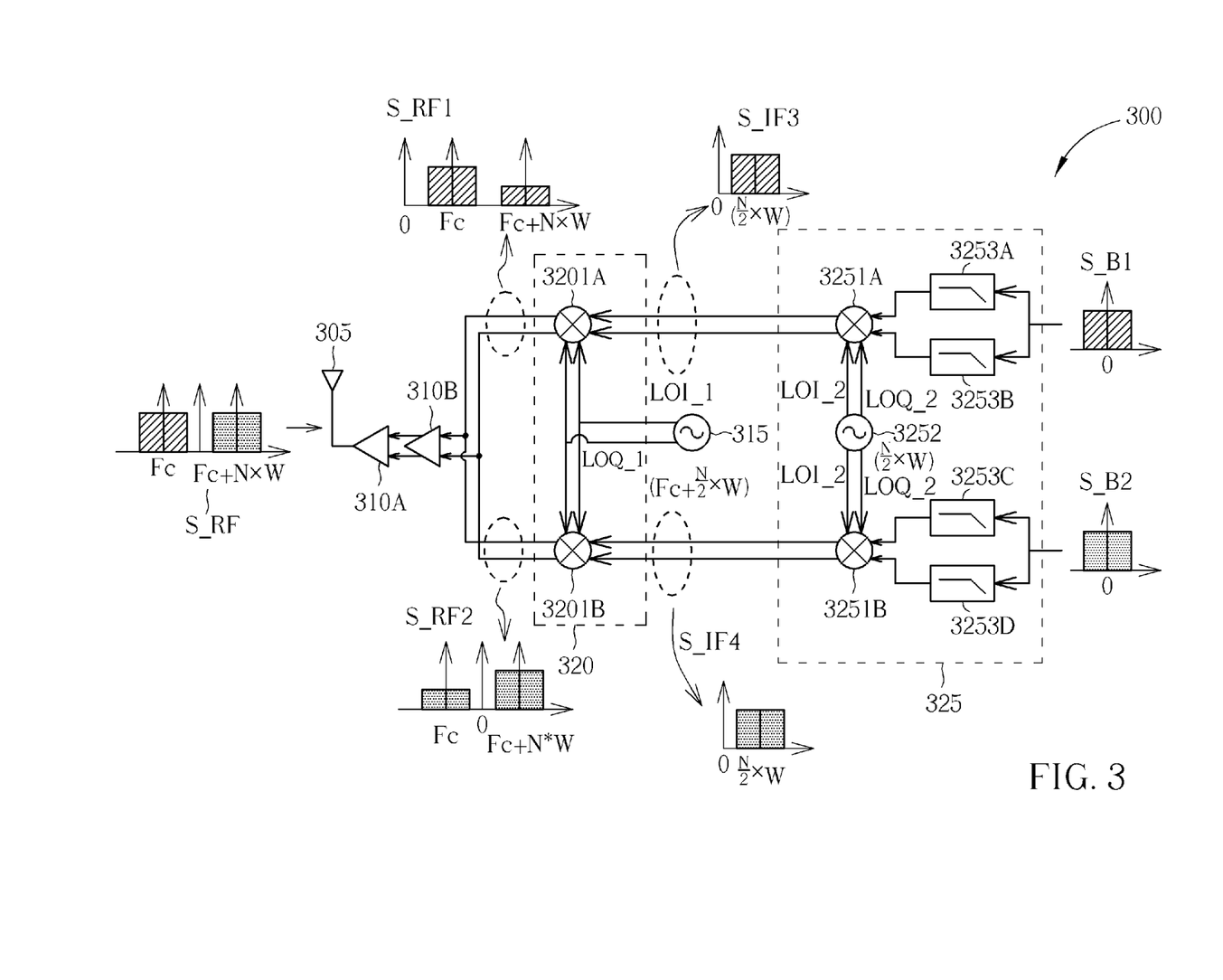
FIG. 3 is a diagram illustrating a transmitter according to a second embodiment of the present invention.

Please refer to FIG. 3, which is a diagram of a transmitter 300 capable of simultaneously transmitting discontinuous frequency band signals at the same time according to a second embodiment of the present invention. The transmitter 300 comprises an antenna 305, a power amplifier 310A, a driving amplifier 310B, a frequency synthesizer 315, an up-conversion circuit 320, and a processing circuit 325. The up-conversion circuit 320 includes first and second up-conversion units 3201A and 3201B, and the processing circuit 325 includes mixers 3251A-3251B and filters 3253A-3253D. The transmitter 300 is utilized for simultaneously processing and transmitting the discontinuous frequency band signals included within the RF signal S_RF. As shown in FIG. 3, the transmitter 300 is arranged to carry and transmit two different baseband signals S_B1 and S_B2 to the air via two discontinuous frequency bands having different center frequencies. The signal S_B1 is a baseband lower sideband signal, and the signal S_B2 is a baseband upper sideband signal. In-phase and quadrature-phase signal components of the baseband signal S_B1 are processed by low-pass filters 3253A and 3253B, respectively, to reduce undesired disturbing noise, and the processed baseband signal S_B1 is converted to an intermediate frequency (IF) signal by the mixer 3251A to generate a first transmitted signal SIF_3 (i.e. the IF signal). Similarly, the baseband signal S_B2 is converted to an IF signal by the mixer 3251B to generate a second transmitted signal SIF_4 (i.e. the IF signal). The local oscillation frequency adopted by the mixers 3251A and 3251B is generated by the frequency synthesizer 3252 and is equal to $(N/2)*W$. The value N is greater than or equal to an integer 2, and can be configured by designers. The value W is the bandwidth size of the baseband signals S_B1 and S_B2.

The frequency synthesizer 3252 is used for generating the in-phase local oscillation signal LOI_2 and quadrature-phase local oscillation signal LOQ_2 according to the oscillation frequency $(N/2)*W$. The signals LOI_2 and LOQ_2 are outputted to the mixers 3251A and 3251B, respectively, and the mixers 3251A and 3251B can therefore perform up-conversion upon the baseband signals S_B1 and S_B2 respectively according to the oscillation frequency $(N/2)*W$ so as to generate IF signals SIF_3 and SIF_4. The center frequencies of IF signals SIF_3 and SIF_4 are located at $(N/2)*W$. Thereafter, the first up-conversion unit 3201A receives the IF signal SIF_3 and converts the IF signal SIF_3 to the RF domain by referring to the local oscillation frequency signal generated by the frequency synthesizer 315, for generating a first up-converted signal. Similarly, the second up-conversion unit 3201B receives the IF signal S_IF4 and converts the IF signal S_IF4 to the RF domain by referring to the local oscillation frequency signal generated by the frequency synthesizer 315, for generating a second up-converted signal. In order to respectively convert two groups of desired signal components to a higher frequency domain so as to make the center frequencies be equal to $F_C$ and $F_C+N*W$, the frequency synthesizer 315 is arranged to generate an oscillation frequency signal having a frequency equal to $F_C+(N/2)*W$. In detail, signal components as illustrated by backslash lines are converted to a higher frequency domain, and the center frequency is located at $F_C$. In addition, signal components as illustrated by dots are converted to a higher frequency domain, and the center frequency is located at $F_C+N*W$. Accordingly, the frequency synthesizer 315 is arranged to generate the in-phase local oscillation signal LOI_1 and the quadrature-phase local oscillation signal LOQ_1 into the first and second up-conversion units 3201A and 3201B respectively. As a result, the first up-conversion unit 3201A is arranged to convert the IF signal SIF_3 into the RF domain according to the in-phase and quadrature-phase local oscillation frequency signals LOI_1 and LOQ_1 having an oscillation frequency $F_C+(N/2)*W$ so that the center frequency of the up-converted signal components is located at $F_C$. Similarly, the second up-conversion unit 3201B is arranged to convert the IF signal SIF_4 into the RF domain according to the in-phase and quadrature-phase local oscillation frequency signals LOI_1 and LOQ_1 having an oscillation frequency $F_C+(N/2)*W$ so that the center frequency of the up-converted signal components is located at $F_C+N*W$. Some image frequency signals may be generated due to up-conversion mentioned above. For example, some image signal components are generated at $F_C+N*W$ when the first up-conversion unit 3201A converts the IF signal SIF_3 to a higher frequency domain to make the up-converted signal components have a center frequency $F_C$. Although some image signals are introduced, using a circuit element having a higher IRR to implement the first up-conversion unit 3201A can achieve significant suppression for the generated image signal components. Consequently, normal/desired signal components are not affected by these image signal components. Similarly, using a circuit element having a higher IRR to implement the second up-conversion unit 3201B can achieve significant suppression for the generated image signal components, and normal/desired signal components are not affected by these image signal components.

By operations of the first and second up-conversion units 3201A and 3201B, the signal components as illustrated by backslash lines can be up-converted to a frequency band having the center frequency $F_C$, and the signal components as illustrated by dots can be up-converted to a frequency band having the center frequency $F_C+N*W$. Since the value N is greater than or equal to the positive integer 2 and the bandwidth of the backslash line signal components or dot signal components is equal to W, the backslash line signal components and dot signal components are carried in the two discontinuous frequency bands of the RF signal S_RF and emitted from the antenna 305 after processed by the driving amplifier 310B and power amplifier 310A. The backslash line signal components are carried and located at a frequency band having a center frequency $F_C$, and the dot signal components are carried and located at a frequency band having a center frequency $F_C+N*W$. The up-conversions of the first and second up-conversion units 3201A and 3201B are associated with the in-phase and quadrature-phase signals of the same local oscillation frequency, and a difference is that the in-phase and quadrature-phase signals components are phase swapped in one up-conversion unit while the in-phase and quadrature-phase signals components are not phase swapped in the other up-conversion unit. Accordingly, the two-way up-conversion can be regarded as the same up-conversion operation used for generating the first and second up-converted signals S_RF1 and S_RF2. Therefore, by employing the circuitry configuration of the up-conversion circuit 320 to merely exchange phases of the in-phase and quadrature-phase signal components during one operation of the same up-conversion, it can be easily achieved for simultaneously processing and transmitting two discontinuous frequency band signals at the same time. Further, the circuitry configuration of phase swapping for the in-phase and quadrature-phase signal components in the operation of up-conversion circuit 320 described above is similar to that for the in-phase and quadrature-phase signal components in the operation of down-conversion circuit 120 as shown in FIG. 1. Since the operation of phase swapping has been clearly described in foregoing paragraphs, detailed description is omitted here for brevity. In addition, it should be noted that the receiver of FIG. 1 and the transmitter of FIG. 3 can be integrated in a single integrated circuit chip to implement a transceiver circuitry configuration. This modification also falls within the scope of the present invention.

Figure 4A:
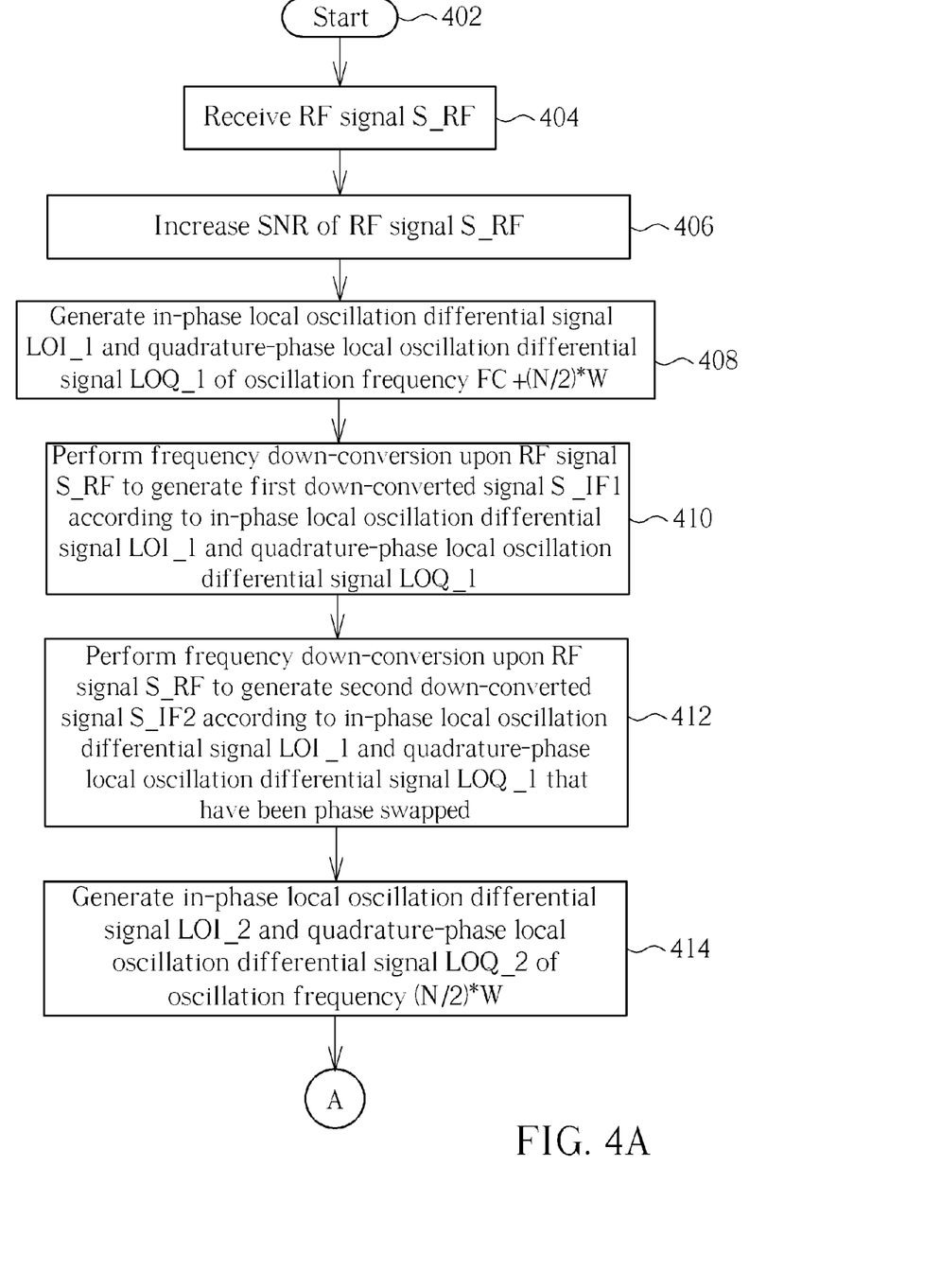
FIGS. 4A-4B are diagrams illustrating operation flows of the receiver as shown in FIG. 1.
Figure 4B:
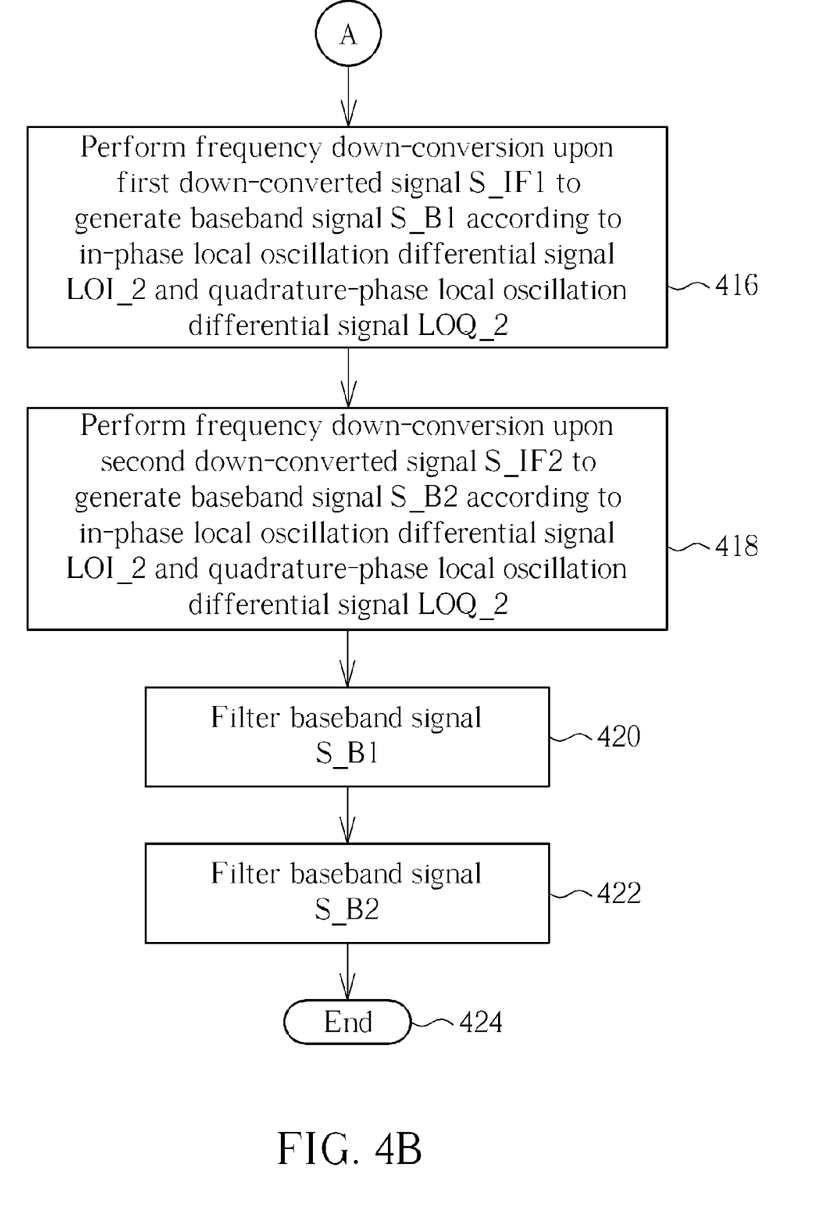

FIG. 4A-FIG. 4B and FIG. 5A-FIG. 5B respectively illustrate the operation flow of the receiver as shown in FIG. 1 and the operation flow of the transmitter as shown in FIG. 3. Provided that substantially the same result is achieved, the steps need not be in the exact order as below and need not be contiguous; that is, other steps can be intermediate. The description of the steps shown in FIGS. 4A-4B and FIG. 5A-5B is detailed in the following:

Step 402: Start;
Step 404: Receive the RF signal S_RF;
Step 406: Increase the signal-to-noise ratio (SNR) of the RF signal S_RF;
Step 408: Generate the in-phase local oscillation differential signal LOI_1 and quadrature-phase local oscillation differential signal LOQ_1 of the oscillation frequency $F_C+(N/2)*W$;
Step 410: Perform frequency down-conversion upon the RF signal S_RF to generate the first down-converted signal S_IF1 according to the in-phase local oscillation differential signal LOI_1 and the quadrature-phase local oscillation differential signal LOQ_1;
Step 412: Perform frequency down-conversion upon the RF signal S_RF to generate the second down-converted signal S_IF2 according to the in-phase local oscillation differential signal LOI_1 and the quadrature-phase local oscillation differential signal LOQ_1 that have been phase swapped;
Step 414: Generate the in-phase local oscillation differential signal LOI_2 and quadrature-phase local oscillation differential signal LOQ_2 of the oscillation frequency $(N/2)*W$;
Step 416: Perform frequency down-conversion upon the first down-converted signal S_IF1 to generate the baseband signal S_B1 according to the in-phase local oscillation differential signal LOI_2 and quadrature-phase local oscillation differential signal LOQ_2;
Step 418: Perform frequency down-conversion upon the second down-converted signal S_IF2 to generate the baseband signal S_B2 according to the in-phase local oscillation differential signal LOI_2 and quadrature-phase local oscillation differential signal LOQ_2;
Step 420: Filter the baseband signal S_B1;
Step 422: Filter the baseband signal S_B2; and
Step 424: End.

Figure 5A:
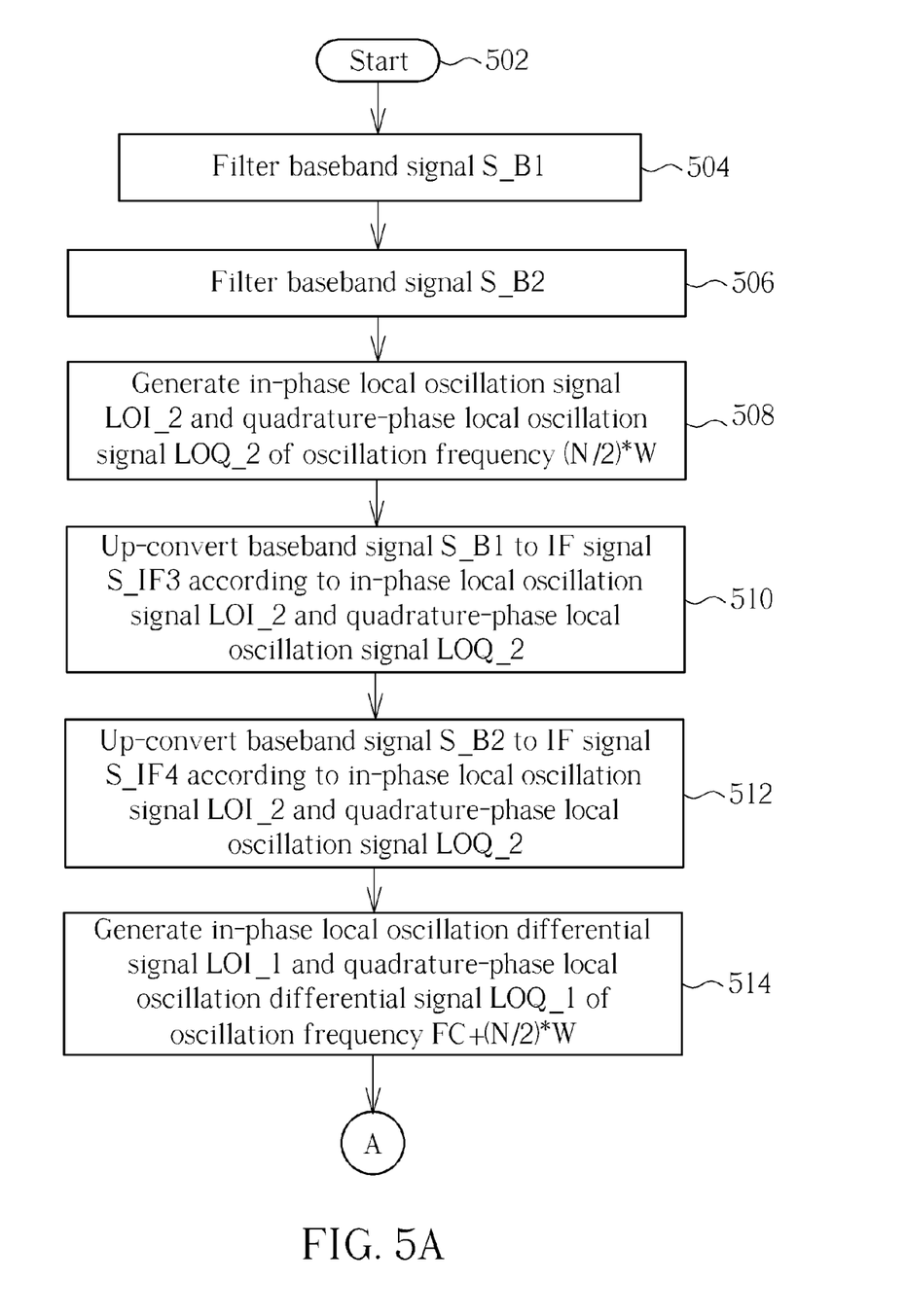
FIGS. 5A-5B are diagrams illustrating operation flows of the transmitter as shown in FIG. 3.
Figure 5B:
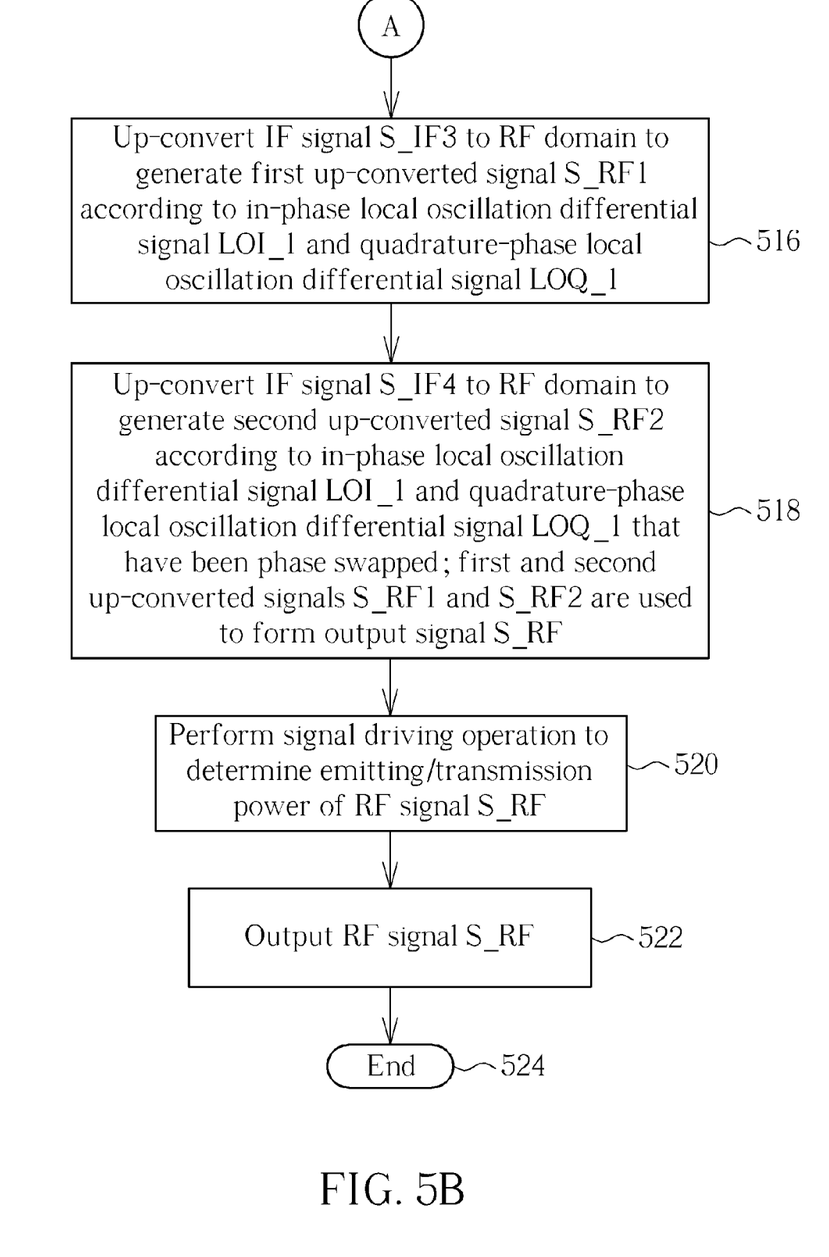

Step 502: Start;
Step 504: Filter the baseband signal S_B1;
Step 506: Filter the baseband signal S_B2;
Step 508: Generate the in-phase local oscillation signal LOI_2 and quadrature-phase local oscillation signal LOQ_2 of the oscillation frequency $(N/2)*W$;
Step 510: Up-convert the baseband signal S_B1 into the IF signal S_IF3 according to the in-phase local oscillation signal LOI_2 and quadrature-phase local oscillation signal LOQ_2;
Step 512: Up-convert the baseband signal S_B2 into the IF signal S_IF4 according to the in-phase local oscillation signal LOI_2 and quadrature-phase local oscillation signal LOQ_2;
Step 514: Generate the in-phase local oscillation differential signal LOI_1 and quadrature-phase local oscillation differential signal LOQ_1 of the oscillation frequency $F_C+(N/2)*W$;
Step 516: Up-convert the IF signal SIF_3 to the RF domain to generate the first up-converted signal S_RF1 according to the in-phase local oscillation differential signal LOI_1 and quadrature-phase local oscillation differential signal LOQ_1;
Step 518: Up-convert the IF signal SIF_4 to the RF domain to generate the second up-converted signal S_RF2 according to the in-phase local oscillation differential signal LOI_1 and quadrature-phase local oscillation differential signal LOQ_1 that have been phase swapped, wherein the first and second up-converted signals S_RF1 and S_RF2 are used to form the output signal S_RF;
Step 520: Perform signal driving operation to determine emitting power of the RF signal S_RF;
Step 522: Output the RF signal S_RF; and
Step 524: End.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A receiver capable of simultaneously receiving discontinuous frequency band signal components of an input signal, comprising:
    a first frequency synthesizer, for generating an in-phase local oscillation differential signal and a quadrature-phase local oscillation differential signal; and
    a down-conversion circuit, coupled to the first frequency synthesizer, for performing frequency down-conversion upon the input signal having discontinuous frequency band signal components comprising a first frequency band signal and a second frequency band signal to generate a first down-converted signal by using the in-phase local oscillation differential signal and the quadrature-phase local oscillation differential signal, and performing the frequency down-conversion upon the input signal to generate a second down-converted signal by using the in-phase local and quadrature-phase oscillation differential signals that have been phase-swapped, wherein the first frequency band signal has a first center frequency and wherein the second frequency band signal has a second center frequency separated from the first center frequency by an offset corresponding to a bandwidth of the first and second frequency bands multiplied by an integer value greater than one, the respective bandwidths of the first and second frequency bands being equal, and wherein a local oscillation frequency of the first frequency synthesizer is equal to a sum of the first center frequency and half of the offset; and
    a processing circuit coupled to the down-conversion circuit, the processing circuit comprising a second frequency synthesizer, wherein a difference between a local oscillation frequency of the second frequency synthesizer and the local oscillation frequency of the first frequency synthesizer is equal to the first center frequency.

2. The receiver of claim 1, wherein the down-conversion circuit is arranged to perform phase swapping upon a positive-terminal signal and a negative-terminal signal of one of the in-phase local and quadrature-phase oscillation differential signals, to obtain the in-phase local and quadrature-phase oscillation differential signals that have been phase-swapped.

3. The receiver of claim 2, wherein the down-conversion circuit is arranged to perform phase swapping upon a positive differential signal and a negative differential signal of the quadrature-phase oscillation differential signal.

4. The receiver of claim 2, wherein the down-conversion circuit is arranged to perform phase swapping upon a positive differential signal and a negative differential signal of the in-phase oscillation differential signal.

5. The receiver of claim 1,
wherein the processing circuit generates a first received signal according to the first down-converted signal and generates a second received signal according to the second down-converted signal, wherein the first and second received signals respectively correspond to the first frequency band signal and the second frequency band signal;
wherein the processing circuit is arranged to perform down conversion upon the first and second down-converted signals respectively to generate the first and second received signals according to an in-phase local oscillation signal and a quadrature-phase local oscillation signal generated by the second frequency synthesizer.

6. A method capable of simultaneously receiving discontinuous frequency band signal components of an input signal, comprising:
providing, by a first frequency synthesizer, an in-phase local oscillation differential signal and a quadrature-phase local oscillation differential signal;
performing frequency down-conversion upon the input signal having discontinuous frequency band signal components comprising a first frequency band signal and a second frequency band signal to generate a first down-converted signal by utilizing the in-phase and quadrature-phase local oscillation differential signals;
performing the frequency down-conversion upon the input signal to generate a second down-converted signal by using the in-phase local and quadrature-phase oscillation differential signals that have been phase-swapped, wherein the first frequency band signal has a first center frequency and wherein the second frequency band signal has a second center frequency separated from the first center frequency by an offset corresponding to a bandwidth of the first and second frequency bands multiplied by an integer value greater than one, the respective bandwidths of the first and second frequency bands being equal, and wherein a local oscillation frequency for performing the down-conversion is equal to a sum of the first center frequency and half of the offset; and
performing frequency down conversion upon the first and second down-converted signals respectively to generate a first received signal and a second received signal according to an in-phase local oscillation signal and a quadrature-phase local oscillation signal generated by a second frequency synthesizer, wherein a difference between a local oscillation frequency of the second frequency synthesizer and the local oscillation frequency of the first frequency synthesizer is equal to the first center frequency.

7. The method of claim 6, further comprising:
performing phase swapping upon a positive-terminal signal and a negative-terminal signal of one of the in-phase local and quadrature-phase oscillation differential signals, to obtain the in-phase local and quadrature-phase oscillation differential signals that have been phase-swapped.

8. The method of claim 7, wherein the performing phase swapping step comprises:
performing phase swapping upon a positive differential signal and a negative differential signal of the quadrature-phase oscillation differential signal.

9. The method of claim 7, wherein the performing phase swapping step comprises:
performing phase swapping upon a positive differential signal and a negative differential signal of the in-phase oscillation differential signal.

10. The method of claim 6,
wherein the first and second received signals respectively correspond to the first frequency band signal component and the second frequency band signal component in the input signal.

11. A transmitter capable of simultaneously transmitting discontinuous frequency band signal components of an output signal, comprising:
a first frequency synthesizer, for generating an in-phase local oscillation differential signal and a quadrature-phase local oscillation differential signal;
an up-conversion circuit, coupled to the first frequency synthesizer, for performing frequency up-conversion upon a first transmitted signal to generate a first up-converted signal by utilizing the in-phase local oscillation differential signal and the quadrature-phase local oscillation differential signal, and performing the frequency up-conversion upon a second transmitted signal to generate a second up-converted signal by utilizing the in-phase local oscillation differential signal and the quadrature-phase local oscillation differential signal that have been phase swapped;
wherein the first and second up-converted signals respectively correspond to the discontinuous frequency band signal components in the output signal comprising a first frequency band signal and a second frequency band signal, wherein the first frequency band signal has a first center frequency and wherein the second frequency band signal has a second center frequency separated from the first center frequency by an offset corresponding to a bandwidth of the first and second frequency bands multiplied by an integer value greater than one, the respective bandwidths of the first and second frequency bands being equal, and wherein a local oscillation frequency of the first frequency synthesizer is equal to a sum of the first center frequency and half of the offset; and
a processing circuit coupled to the up-conversion circuit, the processing circuit comprising a second frequency synthesizer, wherein a difference between a local oscillation frequency of the second frequency synthesizer and the local oscillation frequency of the first frequency synthesizer is equal to the first center frequency.

12. The transmitter of claim 11, wherein the up-conversion circuit is arranged to perform phase swapping upon a positive terminal signal and a negative terminal signal of one of the in-phase and quadrature-phase local oscillation differential signals, to obtain the in-phase local oscillation differential signal and the quadrature-phase local oscillation differential signal that have been phase swapped.

13. The transmitter of claim 12, wherein the up-conversion circuit is arranged to perform phase swapping upon a positive differential signal and a negative differential signal of the quadrature-phase local oscillation differential signal.

14. The transmitter of claim 12, wherein the up-conversion circuit is arranged to perform phase swapping upon a positive differential signal and a negative differential signal of the in-phase local oscillation differential signal.

15. The transmitter of claim 11,
wherein the processing circuit performs frequency up-conversion upon a first baseband signal and a second baseband signal respectively to generate the first and second transmitted signals according to an in-phase local oscillation signal and a quadrature-phase local oscillation signal generated by the second frequency synthesizer.

16. A method capable of simultaneously transmitting discontinuous frequency band signal components of an output signal, comprising:
providing, by a first frequency synthesizer, an in-phase local oscillation differential signal and a quadrature-phase local oscillation differential signal;
performing frequency up-conversion upon a first transmitted signal to generate a first up-converted signal by utilizing the in-phase local oscillation differential signal and the quadrature-phase local oscillation differential signal;
performing the frequency up-conversion upon a second transmitted signal to generate a second up-converted signal by utilizing the in-phase local oscillation differential signal and the quadrature-phase local oscillation differential signal that have been phase swapped;
wherein the first and second up-converted signals respectively correspond to the discontinuous frequency band signal components in the output signal comprising a first frequency band signal and a second frequency band signal, wherein the first frequency band signal has a first center frequency and wherein the second frequency band signal has a second center frequency separated from the first center frequency by an offset corresponding to a bandwidth of the first and second frequency bands multiplied by an integer value greater than one, the respective bandwidths of the first and second frequency bands being equal, and wherein a local oscillation frequency for performing the frequency up-conversion is equal to a sum of the first center frequency and half of the offset; and
performing frequency up-conversion upon a first baseband signal and a second baseband signal respectively to generate the first and second transmitted signals according to an in-phase local oscillation signal and a quadrature-phase local oscillation signal that are generated the a second frequency synthesizer, wherein a difference between a local oscillation frequency of the second frequency synthesizer and the local oscillation frequency of the first frequency synthesizer is equal to the first center frequency.

17. The method of claim 16, further comprising:
performing phase swapping upon a positive terminal signal and a negative terminal signal of one of the in-phase and quadrature-phase local oscillation differential signals, to obtain the in-phase local oscillation differential signal and the quadrature-phase local oscillation differential signal that have been phase swapped.

18. The method of claim 17, wherein a positive differential signal and a negative differential signal of the quadrature-phase local oscillation differential signal are phase swapped.

19. The method of claim 17, wherein a positive differential signal and a negative differential signal of the in-phase local oscillation differential signal are phase swapped.

* * * * *